(12) United States Patent
Ronsisvalle et al.

(10) Patent No.: US 6,696,741 B1
(45) Date of Patent: Feb. 24, 2004

(54) HIGH BREAKDOWN VOLTAGE PN JUNCTION STRUCTURE, AND RELATED MANUFACTURING PROCESS

(75) Inventors: Cesare Ronsisvalle, San Giovanni la Punta (IT); Piero Giorgio Fallica, Catania (IT); Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/443,742

(22) Filed: Nov. 19, 1999

(30) Foreign Application Priority Data

Nov. 26, 1998 (EP) .............................. 98830740

(51) Int. Cl.[7] .............................. H01L 23/58
(52) U.S. Cl. ............................. 257/487
(58) Field of Search ................ 257/330, 335, 257/104, 347, 374, 355, 487, 488, 489, 480, 491, 492, 493, 494, 495, 476, 339

(56) References Cited

U.S. PATENT DOCUMENTS

| | | | |
|---|---|---|---|
| 3,571,675 A | * 3/1971 | Faust | |
| 5,374,583 A | 12/1994 | Lur et al. | 437/67 |
| 5,416,354 A | * 5/1995 | Blackstone | |
| 5,463,241 A | * 10/1995 | Kubo | |
| 5,703,384 A | 12/1997 | Brunner | 257/139 |
| 6,040,600 A | * 3/2000 | Uenishi et al. | |
| 6,169,299 B1 | * 1/2001 | Kawaji et al. | |
| 6,335,250 B1 | * 1/2002 | Egi | |

FOREIGN PATENT DOCUMENTS

| | | | |
|---|---|---|---|
| DE | 2 323 217 | 11/1974 | ............. H01L/7/44 |
| EP | 0 176 747 | 4/1986 | ........... H01L/21/76 |
| EP | 0 750 351 | 12/1996 | ........... H01L/29/78 |
| EP | 0 768 717 | 4/1997 | ......... H01L/29/739 |
| JP | 02135781 A | * 5/1990 | |
| WO | WO-98/06136 | * 2/1998 | |

OTHER PUBLICATIONS

Pierret, "Filed Effect Devices," 1990, Addison–Wesley Publishing Co., vol. 4, p. 30.*
Wolf, "Silicon Processing for the VLSI Era—Vol. 2:Process Integration," 1990, Lattice Press, p. 12 and 48.*
Wolf, "Silicon Processing for the VLSI Era—vol. 3:Submicron MOSFET," Lattice Press, p. 347.*
European Serach Report from EP 98 83 0710 filed Nov. 26, 1998.
Patent Abstracts of Japan, vol. 014, No. 374 (E–0964), Aug. 13, 1990 & JP 02 135781 A (Nisson Motor Co. Ltd.), May 24, 1990.

* cited by examiner

Primary Examiner—Nathan J. Flynn
Assistant Examiner—Kevin Quinto
(74) Attorney, Agent, or Firm—Lisa K. Jorgenson; James H. Morris; Wolf, Greenfield & Sacks, P.C

(57) ABSTRACT

PN junction structure including a first junction region of a first conductivity type, and a second junction region of a second conductivity type, wherein between said first and second junction regions a grid of buried insulating material regions is provided.

20 Claims, 5 Drawing Sheets

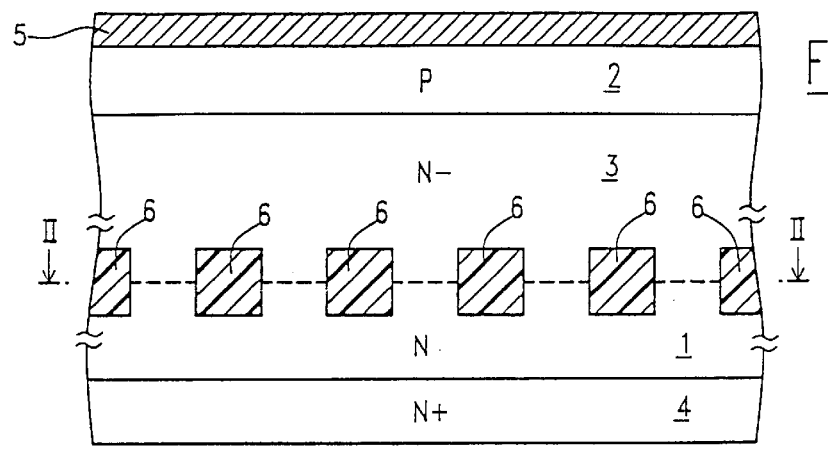
Fig.1
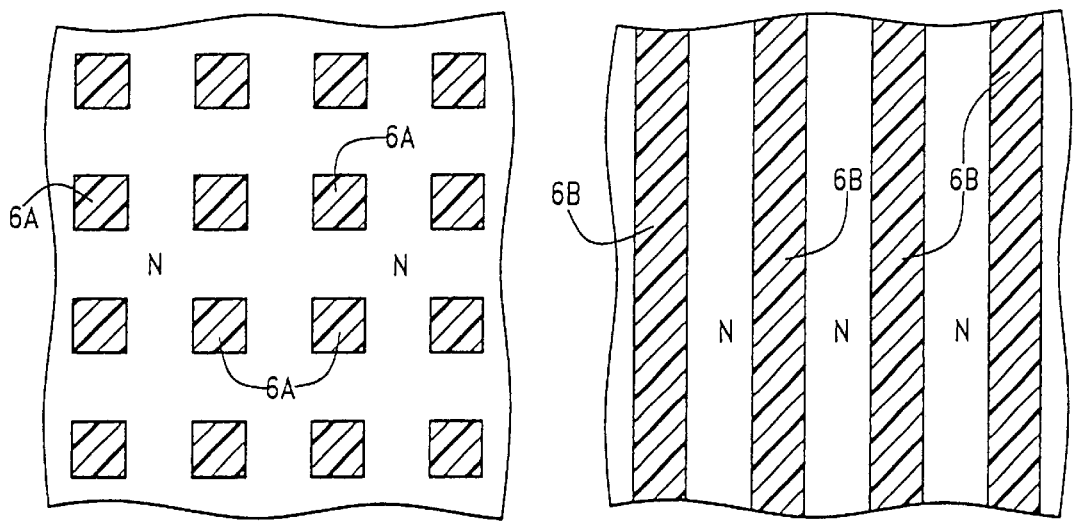
Fig.2A
Fig.2B
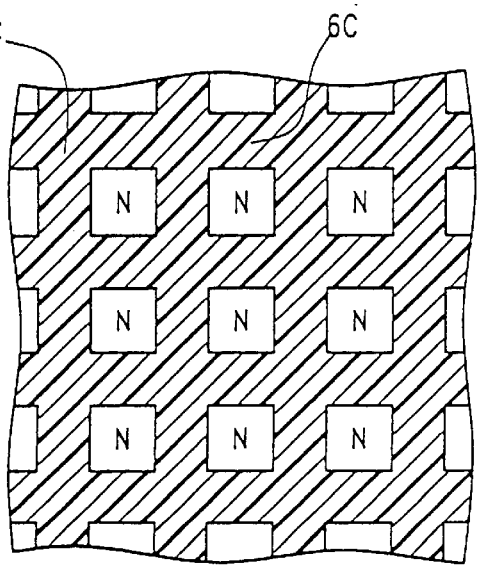
Fig.2C

HIGH BREAKDOWN VOLTAGE PN JUNCTION STRUCTURE, AND RELATED MANUFACTURING PROCESS

BACKGROUND OF THE INVENTION

1. Field of the Invention

The present invention relates to PN junctions and to their fabrication. More specifically, the invention concerns PN junction structures that must sustain high reverse voltages without breaking down.

2. Discussion of the Related Art

Breakdown in a PN junction is due to two different phenomena, depending on the dopant concentrations of the junction's regions: avalanche breakdown and Zener breakdown.

If the dopant concentration of the junction's doped regions is low, avalanche breakdown takes place. If the dopant concentration is high, Zener breakdown occurs.

In both cases, however, junction breakdown occurs when the maximum electric field reaches a critical value. The critical value of the electric field depends on the voltage applied to the junction, as well as on the dopant concentration of the doped regions thereof. To increase the breakdown voltage of a junction it is therefore necessary to decrease the dopant concentration of the doped regions thereof.

On the other hand, a lower dopant concentration makes it necessary to have thicker P and N regions, because the depletion region spreads out. The extension of the depletion region, the concentration of dopants in the silicon and the voltage applied to the junction are linked by the Poisson's equations.

Thicker silicon regions have, however, higher on resistances.

Normally, in power semiconductor devices designed for high voltages, the junctions are of the PIN (P-Intrinsic-N) type, so as to reduce the silicon thickness and thus decreasing the on resistance value. Nevertheless, in these devices the junction area must be augmented to achieve reasonable (i.e., rather low) forward-bias voltage drops. This problem is exacerbated in unipolar conduction devices, where no modulation of conductivity exists.

An object of the present invention is to provide a PN junction structure having a high breakdown voltage.

SUMMARY OF THE INVENTION

According to the present invention, this and other objects are achieved by a PN junction structure comprising a first junction region of a first conductivity type, and a second junction region of a second conductivity type, wherein between said first and second junction regions a grid of buried insulating material regions is provided.

BRIEF DESCRIPTION OF THE DRAWINGS

The features and advantages of the present invention will be made apparent by the following detailed description of some embodiments thereof, illustrated by way of non-limiting examples only in the annexed drawings, wherein:

FIG. 1 shows in cross-section along a vertical plane a PN junction structure according to the present invention;

FIGS. 2A, 2B and 2C shows, in cross-section along line II—II of FIG. 1, three different embodiments of the present invention;

DETAILED DESCRIPTION

Figure 3:
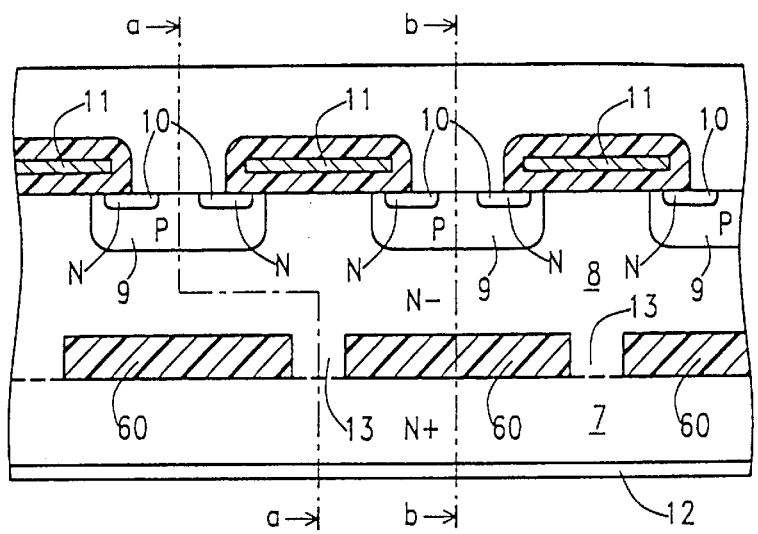
FIG. 3 is a cross-section along a vertical plane of a MOS-gated power device incorporating a PN junction structure according to the present invention.

With reference to FIG. 1, a PN junction structure according to the present invention is shown.

Even if the invention applies in general to PN junctions, the structure shown by way of example is that of a PIN junction. A PIN junction comprises a P junction region, an N junction region and, interposed between the N and P regions, a near intrinsic or lightly doped region. In the shown example, the PIN junction has an N type region or layer 1, a P type region or layer 2, a lightly doped N− region or layer 3 interposed between the P and N regions or layers 1, 2. An N+ region or layer 4 is provided at the N type region or layer 1 side. A metal layer 5 contacts the P type region or layer 2.

Substantially at the interface between the N type region or layer 1 and the N− region or layer 3, a grid of buried silicon dioxide regions 6 is provided. It should be noted that even if the location of the grid of buried silicon dioxide regions 6 at the interface between the N type region or layer 1 and the N− region or layer 3 is preferable, it is not a limitation of the invention. The grid of buried silicon dioxide regions could as well be located in any other position from the interface between regions or layers 1, 3, to the interface between regions or layers 3, 2.

FIGS. 2A, 2B and 2C show three possible embodiments of the grid of oxide regions 6. The grid can be in the form of small isolated pillars 6A, as in FIG. 2A, or in the form of oxide stripes 6B, as in FIG. 2B, or even in the form of a mesh of crossing oxide stripes 6C extending along two orthogonal directions in the plane. Other shapes for the grid of oxide regions 6 are conceivable, the specific shape not being a limitation of the present invention.

The grid of buried oxide regions 6, whatever the form thereof, acts as a field stopper. The high dielectric strength of the oxide is exploited to block the spreading of the depletion region of the junction. A good thermally-grown oxide is capable of sustaining electric fields up to 1000 V/micron.

The buried oxide regions 6 must form a grid, in order to allow flow of current in the forward conduction state. Between the buried oxide regions 6 high-conductivity silicon or polysilicon are preferably provided. The distance between the buried oxide regions 6, i.e. the size of the grid, needs to be properly dimensioned: it must not be too small, so as not to excessively reduce the conduction area, and at the same time it must not be too large, so as not to alter the local distribution of the electric field.

FIG. 3 shows in cross-section a MOS-gated power device provided with a PN junction structure according to the present invention. In particular, the structure is that of a power MOS, with an N+ substrate 7 over which an N− drift layer 8 is provided. P type body regions 9 are formed in the N− drift layer. The P type body regions can either be polygonal cells or stripes. Inside the P type body regions 9, N type source regions 10 are formed. A polysilicon gate 11 is insulatively disposed over the N– drift layer 8 between adjacent P type body regions 9. The polysilicon gate 11 is covered by a dielectric layer 12, and a source metal plate contacts all of the P type body regions 9 and N type source regions 10. A drain metal plate 12 contacts the back surface of N+ substrate 7.

Substantially at the interface between the N+ substrate 7 and the N– drift layer 8, a grid of buried oxide regions 60 are formed according to the present invention. The grid of buried oxide regions 60 can have in principle any shape, for example those shown in FIGS. 2A, 2B, 2C. The holes 13 between the buried oxide regions 60 are preferably located under the polysilicon gate.

Figure 4:
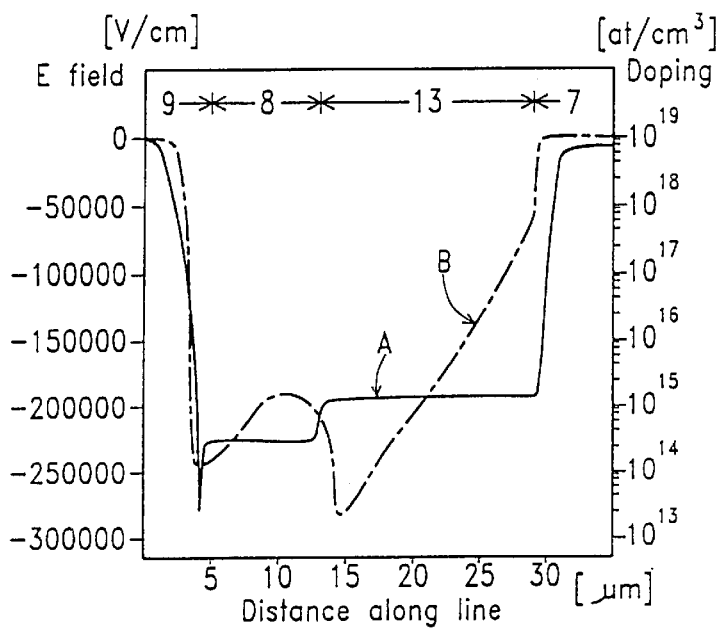
FIG. 4 is a diagram showing the dopant concentration in the doped regions of the MOS-gated power device of FIG. 3, and an electric field distribution along line a—a in FIG. 3.

FIG. 4 is a diagram showing, curve A, the dopant concentration along line a—a of FIG. 3 and, dash-and-dot curve B, the electric field E along the same line a—a. The dopant concentration in the holes 13 between the buried oxide regions 60 is preferably higher than that of the drift layer 8; this assures a good current conduction, and makes it possible to withstand high electric fields. Curve B relates to a case in which the body/drain junction is reverse biased at 500 V. The grid of buried oxide regions acts as a field stopper, blocking the extension of the electric field of the junction P type body regions/drift layer towards the substrate. This is visible in curve B, where the value of the electric field in the holes 13, and thus in the buried oxide regions 60, is significantly higher compared to a situation in which no buried oxide regions are provided. This derives from the fact that silicon dioxide has a relative dielectric constant equal to ⅓ that of silicon. As a result, the thickness of the drift layer can be significantly reduced, with a great benefit for the device's "on" resistance (Ron). As is known, in power devices, and especially in the unipolar ones, the main contribution to the Ron comes from the resistance of the drift layer. The higher the resistivity and the thickness of the drift layer, the higher the device's Ron. In the present structure, the device's Ron is the sum of R1+R2, where R1 is the resistance of the drift layer 8 above the buried oxide regions 60, and R2 is the resistance of the holes 13 between the buried oxide regions 60. R2 depends on the ratio between the area of the holes 13 and the overall area of the device. Assuming by way of example only that such a ratio is equal to 0.35, and assuming also the following:

drift layer thickness: $9 \times 10^{-4}$ cm
drift layer resistivity: 9 Ωcm
buried oxide thickness: $18 \times 10^{-4}$ cm
resistivity inside holes 13: 2.4 Ωcm an Ron of approximately 20 mΩ is obtained. In contrast, a conventional device having the same breakdown voltage, an Ron of approximately 28 mΩ is obtained, that is 40% higher than in the structure according to the invention.

Figure 5:
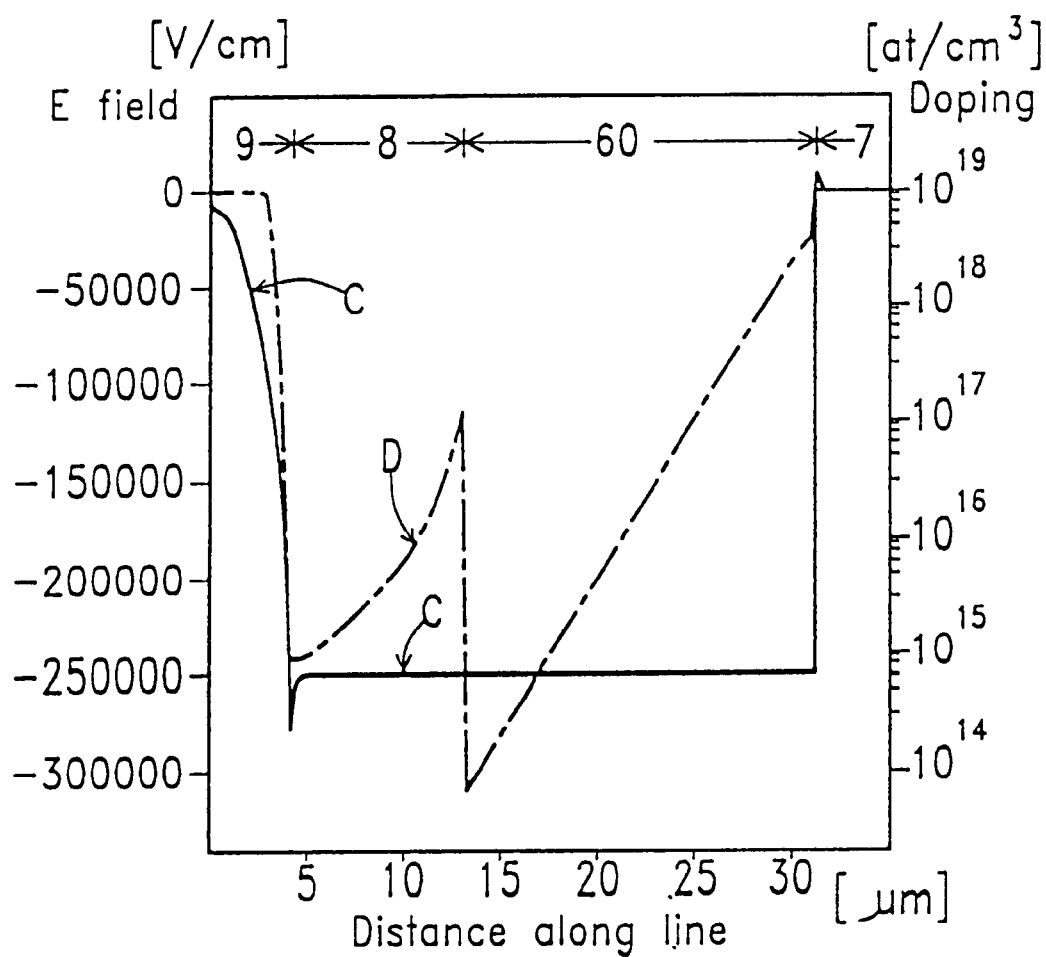
FIG. 5 is a diagram showing the dopant concentration and the electric field distribution along line b—b in FIG. 3.

FIG. 5 shows, similarly to FIG. 4, the dopant concentration (solid curve C) and the electric field E (dash-and-dot curve D) along line b—b in FIG. 3. In this diagram it is possible to note the discontinuity of the electric field between silicon and the oxide: this is due to the higher dielectric constant of silicon compared to that of the oxide (approximately three times), so the electric field in the oxide is three times that in the silicon. It is also possible to note that in the drift layer 8 the slope of the electric field curve D increases near the oxide. As known, in a plane junction, the electric field in the depletion region decreases linearly if the dopant concentration is constant. In the present case, instead, the change in slope in the drift layer 8 is due to the presence of a transverse component of the electric field that increases near the oxide. The presence of a transverse component of the electric field also explains why the electric field in the oxide decreases even if the charge in the oxide is zero.

Figure 6:
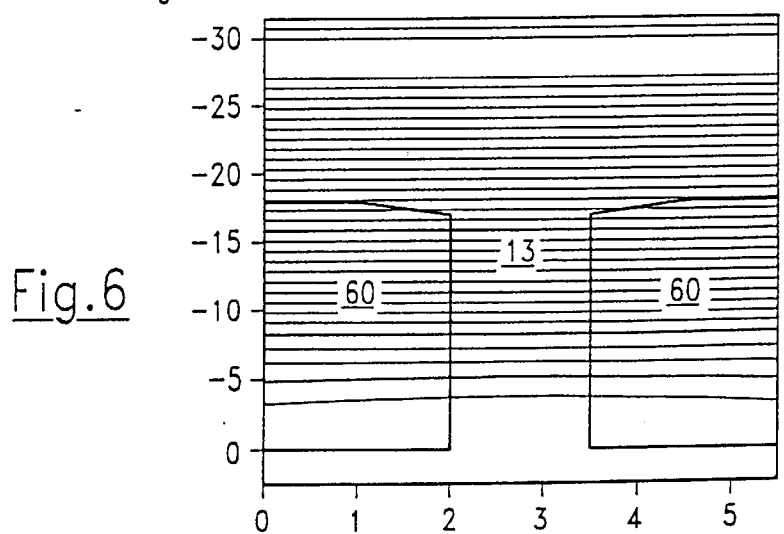
FIG. 6 shows an enlarged detail of FIG. 3, with equipotential lines.

FIG. 6 clearly shows that, by properly dimensioning the size of the holes 13 between the buried oxide regions 60, the equipotential lines are not distorted. Larger holes 13 increase the distortion of the equipotential lines: this causes an increase in the electric field at the corners of the buried oxide regions 60, and a corresponding decrease in the breakdown voltage.

A first embodiment of a manufacturing process for obtaining the PN junction structure according to the invention will be now described making reference to FIGS. 7 to 14.

Figure 7:
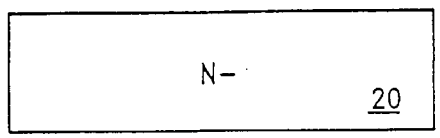
FIGS. 7 to 14 show some steps of a fabrication process according to one embodiment of the present invention.
Figure 8:
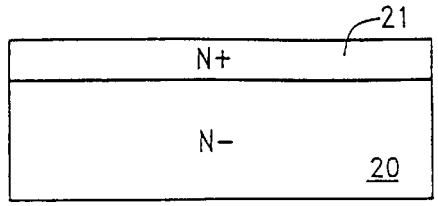

Starting from an N– silicon layer 20 having for example a resistivity of 10 to 40 Ωcm, as shown in FIG. 7, an N+ layer 21 of, for example, 0.5 Ωcm, is formed, e.g. by means of epitaxial growth, on a first surface of layer 20 to obtain the structure shown in FIG. 8. Layer 21 should preferably have a thickness equal to the thickness of the buried oxide regions which are to be formed, for example from 2 to 3 μm.

Figure 9:
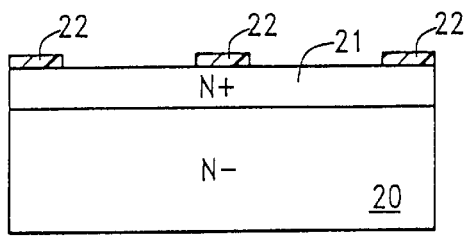

Then, a layer of silicon nitride is formed over the free surface of layer 21. More specifically, before forming the silicon nitride layer, an oxide layer ("pad oxide") is conventionally formed over the free surface of layer 21. The silicon nitride layer is then selectively removed to obtain silicon nitride regions 22, as shown in FIG. 9.

Figure 10:
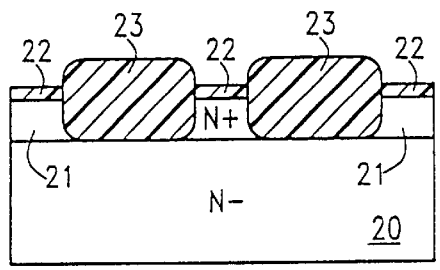

A thermal oxidation is then performed (Local Oxidation or "LOCOS") to form oxide regions 23 between the silicon nitride regions 22, as shown in FIG. 10.

Figure 11:
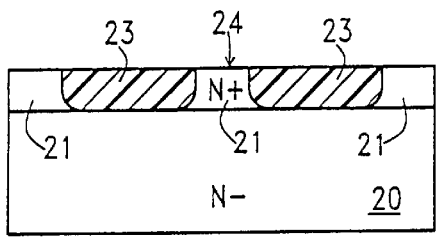
Figure 12:
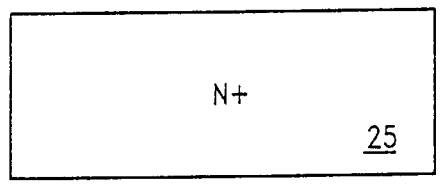

After the thermal oxidation, the residual silicon nitride regions 22 are removed, and a planarization process is performed to obtain a planar surface 24, as shown in FIG. 11.

Figure 13:
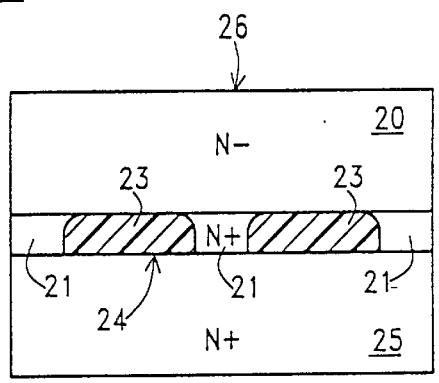

A conventional N+ substrate 25 (FIG. 12) having, for example, a resistivity of less than 25 Ωcm is bonded at one surface thereof to the planar surface 24, for example by means of the conventional Silicon Direct Bonding (SDB) technique, so that the structure of FIG. 13 is obtained.

Figure 14:
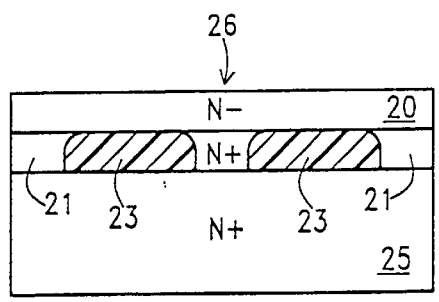

Then, layer 20 is reduced in thickness at the second surface 26 thereof, now the free surface, till the desired thickness is reached, for example 10 to 100 μm. The structure of FIG. 14 is thus obtained. Buried oxide regions 23 are provided at the interface between the N+ substrate 25 and the N– layer 20.

From this point on, the process continues with the conventional steps of any known process, depending on the kind of device to be fabricated. For example, in the case of a power MOS as shown in FIG. 3, layer 20 will form the drift layer of the device, and body regions such as the body regions 9 of FIG. 3 will be formed in the drift layer 20 at the surface 26 thereof.

The process according to the embodiment previously described is suitable, in particular, when the buried oxide regions do not need to be very thick. When thicker buried oxide regions are desired, a more suitable manufacturing process is the one which will be now described.

Figure 15:
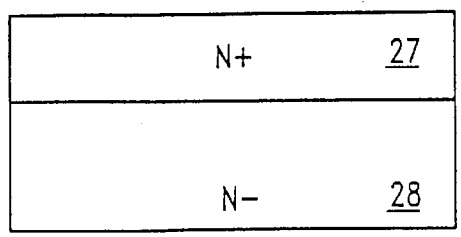
FIGS. 15 to 20 show some steps of a fabrication process according to another embodiment of the present invention.

As in the previous case, an N+ layer 27 is epitaxially grown over an N– layer 28 (FIG. 15). Even in this case, the thickness of the N+ layer 27 is approximately equal to the thickness of the buried oxide regions which have to be formed.

Figure 16:
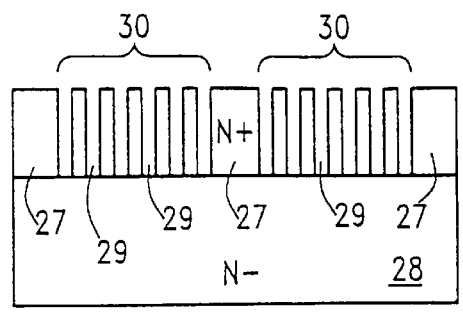

Then, groups 30 of rather closely spaced trenches 29 are formed in the N+ layer 27. The trenches 29 reach the N– layer 28, as shown in FIG. 16.

Figure 17:
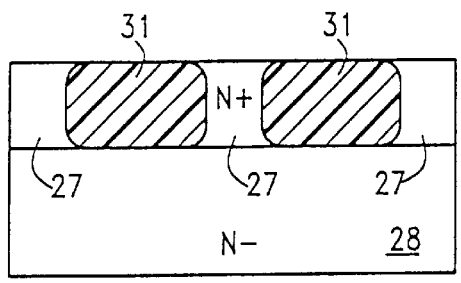

An oxidation process is then carried out, so that in each trench, the oxide layers grown on the walls thereof completely fill the trench, and also the portions of silicon between contiguous trenches are converted into silicon dioxide so to form substantially continuous oxide regions 31, as shown in FIG. 17.

Figure 18:
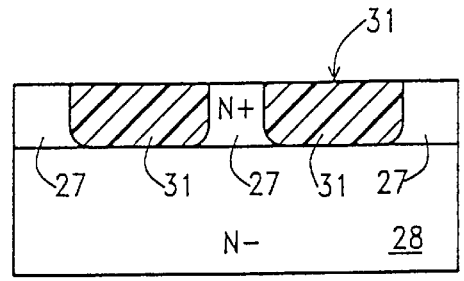
Figure 19:
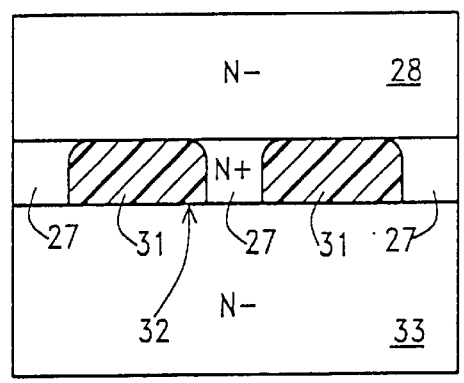

Then, the free surface 32 of layer 27 is planarized (FIG. 18), and an N+ substrate 33 is bonded to layer 27 at surface 32 by means of SDB technique (FIG. 19).

Figure 20:
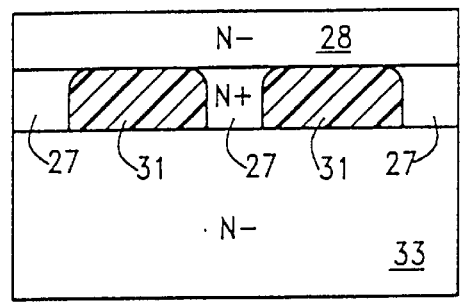

Similarly to the previous embodiment, after bonding to the N+substrate 33 the free surface 34 of layer 28 is submitted to a thickness reduction to attain the desired thickness (FIG. 20), and the process can follow in any of the conventional ways, depending on the device to be integrated.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A semiconductor device, comprising:
   a first junction region of a first conductivity type;
   a second junction region of a second conductivity type;
   a third region of the first conductivity type disposed between the first junction region and the second junction region;
   and a grid of buried insulating material regions located at one of a first interface between the first junction region and the third region and a second interface between the second junction region and the third region;
   wherein said grid of buried insulating material regions comprises a two dimensional arrangement of crossing insulating material strips.

2. The device of claim 1, wherein the third region is more lightly doped than the first region.

3. A semiconductor device, comprising:
   a heavily doped semiconductor substrate;
   a lightly doped drift layer of a first conductivity type over said substrate;
   at least one body region of a second conductivity type formed in the drift layer;
   a source region of the first conductivity type formed inside the body region; and
   a grid of buried insulating material regions disposed in the drift layer.

4. The device according to claims 3, wherein said grid of buried insulating material regions is located at an interface between the substrate and the drift layer.

5. The device according to claim 3, wherein between said buried insulating material regions doped semiconductor regions of the first conductivity type are provided having a dopant concentration higher than that of the drift layer.

6. The device according to claim 3, wherein said grid of buried insulating material regions comprises a two dimensional arrangement of insulating material pillars.

7. The device according to claim 3, wherein said grid of buried insulating material regions comprises substantially parallel strips of insulating material.

8. The device according to claim 3, wherein said grid of buried insulating material regions comprises a two dimensional arrangement of crossing insulating material strips.

9. The device according to claim 4, said at least one body region comprising a plurality of body regions and having an insulated gate insulatively disposed over the drift layer between the body regions, wherein said grid of buried insulating material regions comprises holes located substantially under said insulated gate and substantially midway between adjacent body regions.

10. The device according to claim 9, wherein said buried insulating material regions are oxide regions.

11. A semiconductor device, comprising:
    a first junction region of a first conductivity type;
    a second junction region of a second conductivity type;
    a third region of the first conductivity type disposed between the first junction region and the second junction region;
    and a grid of buried insulating material regions located at one of a first interface between the first junction region and the third region and a second interface between the second junction region and the third region;
    wherein the third region is lightly doped.

12. The device according to claim 11, wherein said insulating material is oxide.

13. The device according to claim 11, wherein said grid of buried insulating material regions comprises a two dimensional arrangement of insulating material pillars.

14. The device according to claim 11, wherein said grid of buried insulating material regions comprises substantially parallel strips of insulating material.

15. The device of claim 11, wherein the grid of buried insulating material regions is located at the first interface.

16. A semiconductor device, comprising:
    a first junction region of a first conductivity type;
    a second junction region of a second conductivity type;
    a grid of buried insulating material regions located between the first junction region and the second junction region;
    wherein the grid of buried insulating material regions comprises a two dimensional arrangement of crossing insulating material strips.

17. A semiconductor device, comprising:
    a heavily doped semiconductor substrate;
    a lightly doped drift layer of a first conductivity type over said substrate;
    at least one body region of a second conductivity type formed in the drift layer;
    a source region of the first conductivity type formed inside the body region; and
    a grid of buried insulating material regions disposed in the drift layer,
    wherein between said buried insulating material regions doped semiconductor regions of the first conductivity type are provided having a dopant concentration higher than that of the drift layer.

18. A semiconductor device, comprising:
    a heavily doped semiconductor substrate;
    a lightly doped drift layer of a first conductivity type over said substrate;
    at least one body region of a second conductivity type formed in the drift layer;
    a source region of the first conductivity type formed inside the body region; and
    a grid of buried insulating material regions disposed in the drift layer, wherein said grid of buried insulating material regions comprises a two dimensional arrangement of insulating material pillars.

19. A semiconductor device, comprising:

a heavily doped semiconductor substrate;

a lightly doped drift layer of a first conductivity type over said substrate;

at least one body region of a second conductivity type formed in the drift layer;

a source region of the first conductivity type formed inside the body region; and a grid of buried insulating material regions disposed in the drift layer, wherein said grid of buried insulating material regions comprises substantially parallel strips of insulating material.

20. A semiconductor device, comprising:

a heavily doped semiconductor substrate;

a lightly doped drift layer of a first conductivity type over said substrate;

at least one body region of a second conductivity type formed in the drift layer;

a source region of the first conductivity type formed inside the body region; and a grid of buried insulating material regions disposed in the drift layer, wherein said grid of buried insulating material regions comprises a two dimensional arrangement of crossing insulating material strips.

* * * * *

UNITED STATES PATENT AND TRADEMARK OFFICE
CERTIFICATE OF CORRECTION

PATENT NO. : 6,696,741 B1
DATED : February 24, 2004
INVENTOR(S) : Cesare Ronsisvalle, Piero Giorgio Fallica and Davide Patti It is certified that error appears in the above-identified patent and that said Letters Patent is hereby corrected as shown below:

<u>Title page,</u>
Item [30], should read:
-- [30]   Foreign Application Priority Data
   Nov. 26, 1998  (EP) ……………... 98830710.4 --

<u>Column 5,</u>
Lines 50-52, should read as follows:
-- 4.  The device according to claim 3, wherein said grid of buried insulating material regions is located at an interface between the substrate and the drift layer. --

Signed and Sealed this

Eighteenth Day of May, 2004

JON W. DUDAS
*Acting Director of the United States Patent and Trademark Office*